(12) United States Patent
Choi et al.

(10) Patent No.: US 8,514,211 B2
(45) Date of Patent: Aug. 20, 2013

(54) DISPLAY PANEL

(75) Inventors: Min-Hyuk Choi, Cheonan-si (KR);
Chun-Gi You, Hwaseong-si (KR);
Jong-Hyun Park, Yongin-si (KR);
Doo-Hyun Woo, Anyang-si (KR);
Dong-Ki Lee, Seongnam-si (KR);
Young-Dong Kwon, Asan-si (KR);
Jin-Hee Kang, Suwon-si (KR)

(73) Assignee: Samsung Display Co., Ltd. (KR)

( * ) Notice: Subject to any disclaimer, the term of this patent is extended or adjusted under 35 U.S.C. 154(b) by 669 days.

(21) Appl. No.: 12/426,074

(22) Filed: Apr. 17, 2009

(65) Prior Publication Data

US 2010/0085342 A1    Apr. 8, 2010

(30) Foreign Application Priority Data

Oct. 8, 2008    (KR) .................. 10-2008-0098646

(51) Int. Cl.
*G09G 5/00*    (2006.01)

(52) U.S. Cl.
USPC ..................... 345/211; 345/694; 349/139

(58) Field of Classification Search
USPC .............. 345/690; 349/139–144, 38–39
See application file for complete search history.

(56) References Cited

U.S. PATENT DOCUMENTS

| | | | |
|---|---|---|---|
| 7,714,970 B2 * | 5/2010 | Kim et al. ............ | 349/144 |
| 2004/0108978 A1 * | 6/2004 | Matsueda et al. ........ | 345/76 |
| 2005/0030439 A1 * | 2/2005 | Lyu ...................... | 349/38 |
| 2005/0128413 A1 * | 6/2005 | Son et al. ............... | 349/143 |
| 2006/0262262 A1 * | 11/2006 | Kim et al. ............. | 349/139 |
| 2007/0064020 A1 * | 3/2007 | Credelle et al. ......... | 345/694 |
| 2007/0064187 A1 * | 3/2007 | Takeda et al. ........... | 349/127 |
| 2008/0225191 A1 * | 9/2008 | Ohara et al. ............. | 349/39 |
| 2008/0225195 A1 * | 9/2008 | Oohara et al. ........... | 349/46 |
| 2010/0007804 A1 * | 1/2010 | Guncer .................. | 348/790 |

FOREIGN PATENT DOCUMENTS

| | | |
|---|---|---|
| JP | 2005-215668 | 8/2005 |
| JP | 2008-003185 | 1/2008 |
| KR | 10-2006-0114573 | 11/2006 |

OTHER PUBLICATIONS

English Abstract for Publication No. KR 10-2006-0114573.
English Abstract for Publication No. JP 2008-003185.
English Abstract for Publication No. JP 2005-215668.

* cited by examiner

*Primary Examiner* — Amare Mengistu
*Assistant Examiner* — Sarvesh J Nadkarni
(74) *Attorney, Agent, or Firm* — Innovation Counsel LLP (57) ABSTRACT

A display panel includes a power line supplying power, and a plurality of pixels connected with the power line, each pixel including a plurality of sub-pixel regions, and receiving the power to display an image. Each of the pixels further includes a plurality of driving thin film transistors and a plurality of light emitting units. Each of the driving thin film transistors are positioned in respective sub-pixel regions to receive the power to output driving signals. Each of the light emitting units are connected to respective driving thin film transistors, have relatively longer lengths in a first direction, and have the same width in a second direction substantially perpendicular to the first direction. One among the plurality of light emitting units is longer than the remaining light emitting units to thereby improve a light emitting efficiency and image display quality of a display panel.

10 Claims, 7 Drawing Sheets

Fig. 6 ly upon Korean Patent
DISPLAY PANEL

CROSS-REFERENCE TO RELATED APPLICATION

This application relies for priority upon Korean Patent Application No. 2008-98646 filed on Oct. 8, 2008, the contents of which are herein incorporated by reference in their entirety.

BACKGROUND

1. Field of the Invention

The present invention relates to a display panel. More particularly, the present invention relates to a display panel capable of improving a light emitting efficiency.

2. Description of the Related Art

An organic light emitting device includes two electrodes and a light emitting layer interposed between the two electrodes. Electrons injected from one electrode are combined with holes injected from the other electrode in the light emitting layer to form excitons that discharge energy to emit light. Since the organic light emitting device is a self-emissive device, the organic light emitting device does not require an additional light source. Accordingly, the organic light emitting device is advantageous in terms of power consumption, a response speed, a viewing angle, and a contrast ratio.

The organic light emitting device emits red, green, blue, and white light according to the light emitting materials used. The organic light emitting device generating the white light includes a color filter to express a color. The light emitting efficiency of the organic light emitting device varies depending on the light emitting materials and the color filters used.

SUMMARY

Therefore, an embodiment of the present invention provides a display panel having a pixel structure representing a high light emitting efficiency.

In an embodiment of the present invention, a display panel includes a power line supplying power, and a plurality of pixels connected with the power line, including a plurality of sub-pixel regions, and receiving the power to display an image.

The pixels comprise a plurality of driving thin film transistors and a plurality of pixel electrodes. Each of the driving thin film transistors are positioned in a respective sub-pixel region to receive the power such that driving signals are output. The plurality of pixel electrodes have a relatively longer length in a first direction, and have a same width in a second direction substantially perpendicular to the first direction. At least one of the plurality of pixel electrodes is longer than the remaining pixel electrodes in the first direction. The display panel further comprises three color filter layers positioned below the plurality of pixel electrodes and having a same area. The three color filter layers may have red, green, and blue colors, respectively. The color filter layer having the blue color is provided below one pixel electrode, which has a longest length in the first direction, among the plurality of pixel electrodes. The display panel may further include three organic light emitting layers with each positioned on a respective pixel electrode to generate white light.

The power line is interposed between the driving thin film transistors and the pixel electrodes, and has widths that vary depending on lengths of the pixel electrodes. The power line supplies a voltage having a ground level to the driving thin film transistors. The display panel may further include three organic light emitting layers with each provided on a respective pixel electrode and having a same area.

As described above, a light emitting unit representing a blue color among three light emitting units has the largest area, and a light emission region is enlarged, so that a light emitting efficiency can be improved. Accordingly, the quality of an image displayed on a display panel can be improved.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Hereinafter, preferred embodiments of a display panel will be described in detail with reference to the accompanying drawings.

It should be understood that the present invention is not limited to appended drawings but includes all modifications, equivalents and alternatives within the spirit and scope of the present invention as defined in the following claims. The appended drawings are not necessarily to scale, presenting a somewhat extended or reduced representation of partial elements to illustrate various layers and regions more clearly. In addition, the same reference numerals are used to designate the same elements throughout the drawings.

Figure 1:
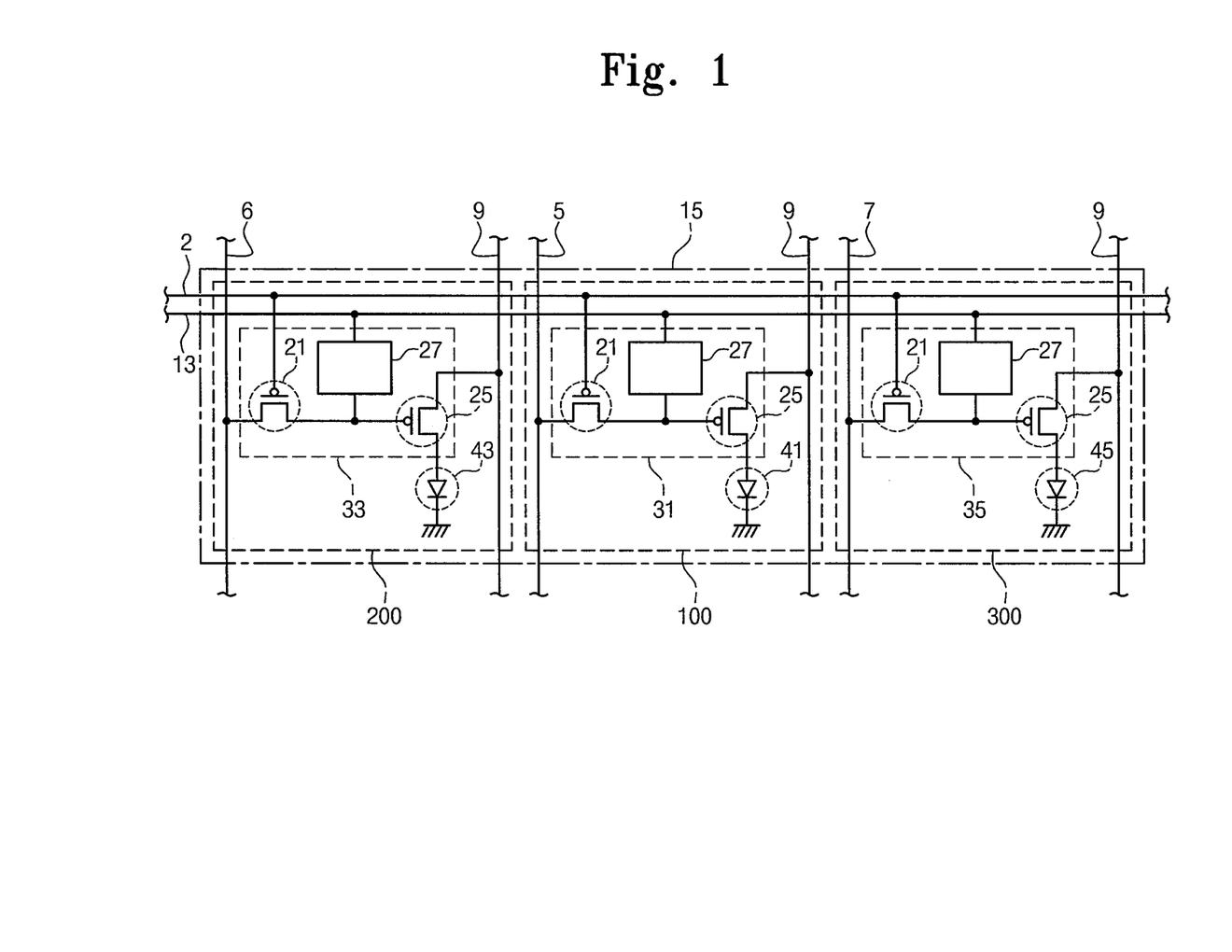
FIG. 1 is a circuit diagram showing a display panel according to an embodiment of the present invention.

FIG. 1 is a circuit diagram showing a display panel according to an embodiment of the present invention.

Referring to FIG. 1, the display panel includes a plurality of signal lines 2, 5, 6, 7, 9, and 13 and a plurality of pixels 15 connected thereto while being regularly arranged.

The signal lines include a gate line 2 delivering a gate signal, a plurality of data lines 5, 6, and 7 delivering data signals, a plurality of first source voltage lines 9 delivering a first source voltage, and a second source voltage line 13 delivering a second source voltage of about 0V. The gate line 2 extends in a second direction, and may be connected to the pixels 15 if necessary. The data lines are classified into first to third data lines 5, 6, and 7, and extend in a first direction perpendicular to the second direction. The first source voltage lines 9 are arranged in parallel to the first to third data lines 5 to 7, and at least one first source voltage line 9 may be connected to the pixels 15. The second source voltage line 13 is arranged in parallel to the gate line 2. However, the second source voltage line 13 is not limited thereto.

The pixels 15 include three sub-pixel regions 100 to 300. According to the present embodiment, the sub-pixel regions 100 to 300 are regions in which sub-pixels are formed, and, hereinafter, the sub-pixel regions 100 to 300 will be described as first to third sub-pixels 100 to 300.

The first sub-pixel unit 100 includes a first thin film transistor circuit unit 31 connected to the gate line 2, the first data line 5, the first source voltage line 9, and the second source voltage line 13, and a first light emitting unit 41 connected to the first thin film transistor circuit unit 31.

The first thin film transistor circuit unit 31 includes at least one thin film transistor to drive the first light emitting unit 41. For example, the first thin film transistor circuit unit 31 may include a switching thin film transistor 21, a driving thin film transistor 25, and a compensation circuit unit 27.

The switching thin film transistor 21 includes a control terminal, an input terminal, and an output terminal. The control terminal is connected to the gate line 2, the input terminal is connected to the first data line 5, and the output terminal is connected to the driving thin film transistor 25. For example, the first data line 5 may be an nth data line, in which n is one of natural numbers equal to 2 or more. The switching thin film transistor 21 transmits a data voltage applied to the first data line 5 to the driving thin film transistor 25 in response to a gate voltage applied to the gate line 2. The switching thin film transistor 21 may be a PMOS transistor in one example.

The driving thin film transistor 25 includes a control terminal, an input terminal, and an output terminal like the switching thin film transistor 21. The control terminal is connected to both the output terminal of the switching thin film transistor 21 and the compensation circuit unit 27. The input terminal is connected to the first source voltage line 9, and the output terminal is connected to the first light emitting unit 41. The driving thin film transistor 25 applies an output current to the first light emitting unit 41. The intensity of the output current is changed according to a voltage between the input terminal and the output terminal of the driving thin film transistor 25. The driving thin film transistor 25 may be a PMOS transistor in one example.

The compensation circuit unit 27 can prevent an amount of the output current supplied to the light emitting unit 41 from being changed due to the deviation of a threshold voltage of the driving thin film transistor 25 caused by a non-uniform manufacturing process. For example, the compensation circuit unit 27 may include a capacitor and a plurality of thin film transistors. The compensation circuit unit 27 reduces the threshold voltage from the voltage between the control terminal and the output terminal of the driving thin film transistor 25 by using the second source voltage of 0V applied from the second source voltage line 13. Accordingly, the compensation circuit unit 27 drives the driving thin film transistor 25 such that the output current is determined by the data voltage regardless of the threshold voltage.

The second sub-pixel unit 200 includes a second thin film transistor circuit unit 33 connected to the gate line 2, the second data line 6, the first source voltage line 9, and the second source voltage line 13 and a second light emitting unit 43 connected to the second thin film transistor circuit unit 33. For example, the second data line 6 may be an $(n-1)^{th}$ data line, in which the n is a natural number equal to 2 or more.

The second thin film transistor circuit unit 33 includes at least one thin film transistor to drive the second light emitting unit 43. For example, the second thin film transistor circuit unit 33 includes the driving thin film transistor 25, the switching thin film transistor 21, and the compensation circuit unit 27. Since the switching thin film transistor 21, the driving thin film transistor 25, and the compensation circuit unit 27 have been already described in the above description of the first thin film transistor circuit unit 31, details thereof will be omitted in order to avoid redundancy.

The third sub-pixel unit 300 includes a third thin film transistor circuit unit 35 connected to the gate line 2 and the third data line 7, and a third light emitting unit 45 connected to the third thin film transistor circuit unit 35. For example, the third data line 7 may be an $(n+1)^{th}$ data line, in which the n is a natural number equal to 2 or more.

The third thin film transistor circuit unit 35 includes at least one thin film transistor to drive the third light emitting unit 45. For example, the third thin film transistor circuit unit 35 includes the switching thin film transistor 21, the driving thin film transistor 25, and the compensation circuit unit 27. Since the switching thin film transistor 21, the driving thin film transistor 25, and the compensation circuit unit 27 have been already described in the above description of the first thin film transistor circuit unit 31, details thereof will be omitted in order to avoid redundancy.

Hereinafter, a pixel structure according to an embodiment of the present invention will be described with reference to FIGS. 2 and 3.

Figure 2:
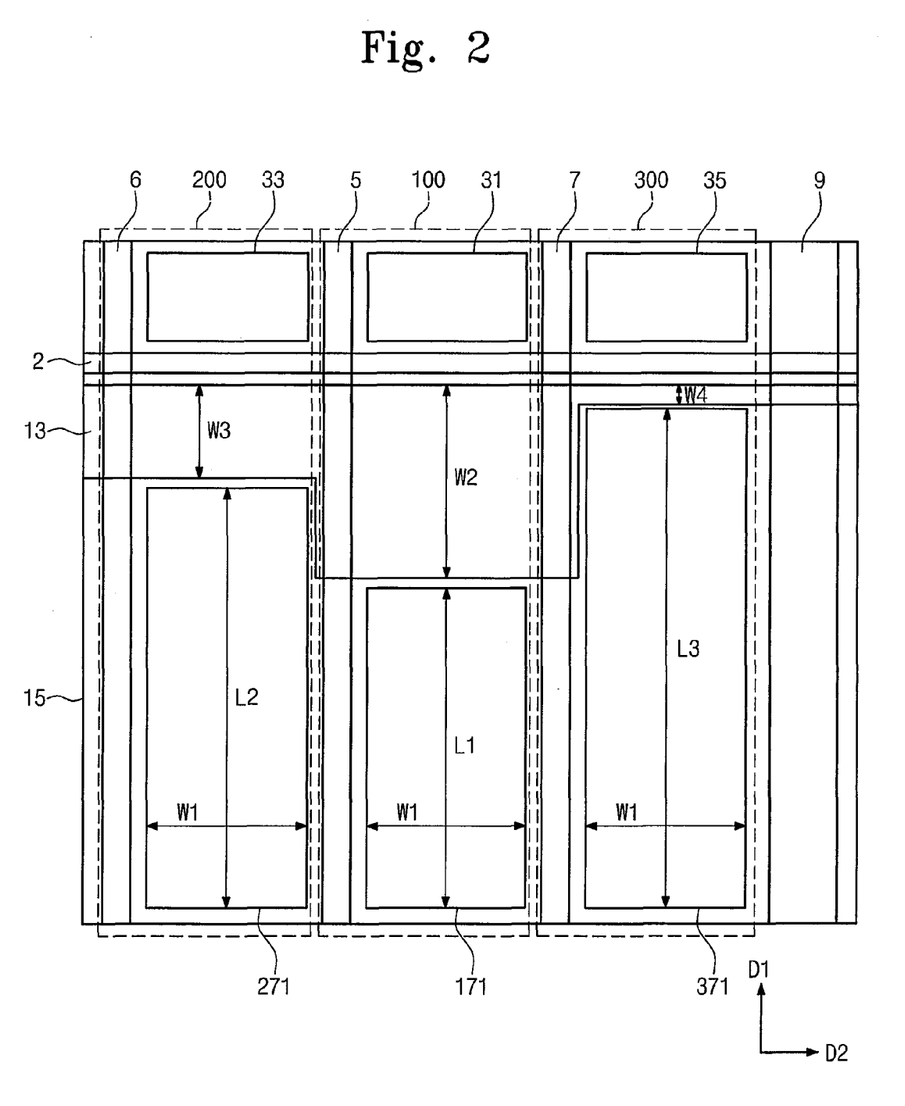
FIG. 2 is a plan view showing a pixel structure according to a first embodiment of the present invention.
Figure 3:
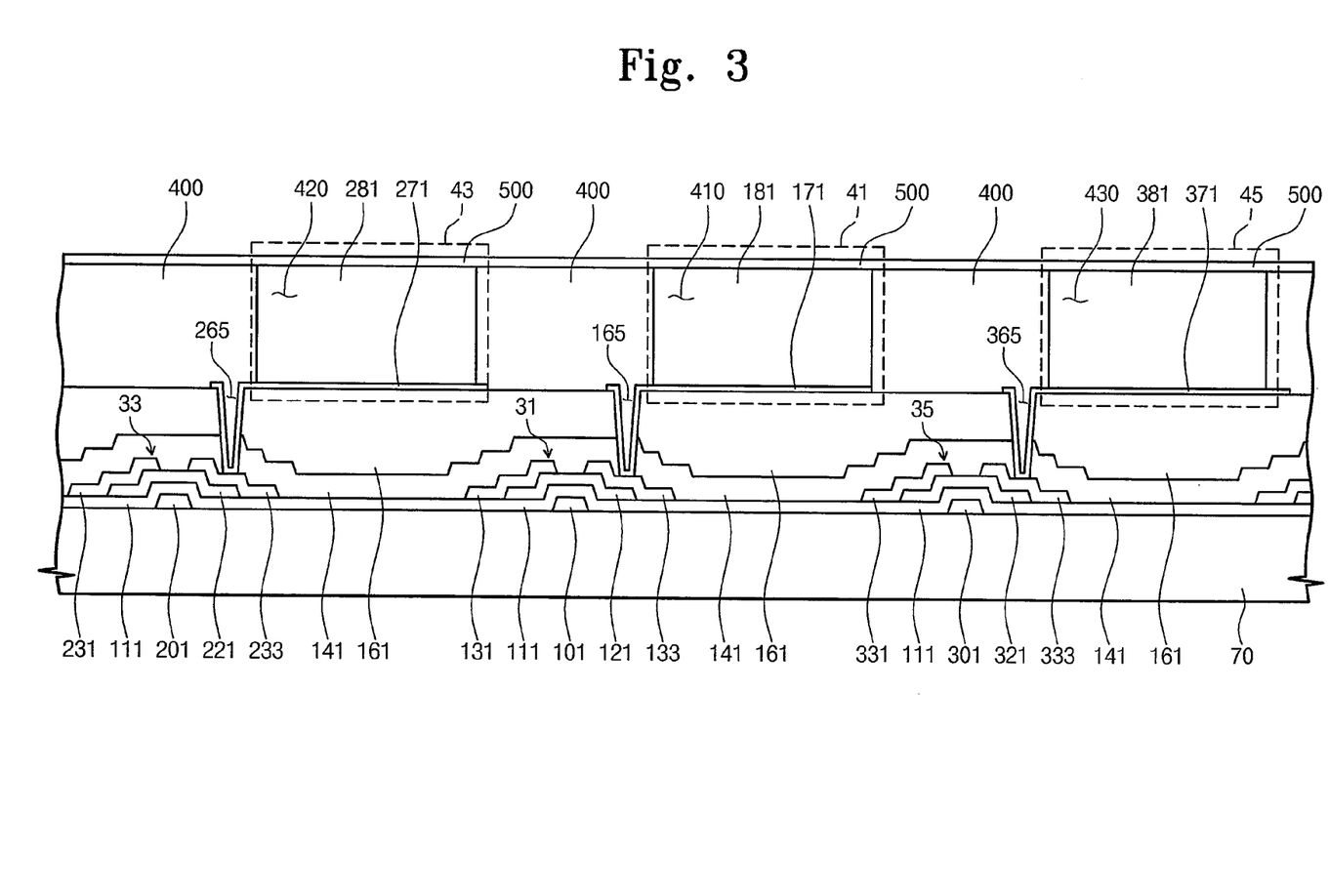
FIG. 3 is a sectional view showing the pixel structure according to the first embodiment of the present invention.

FIG. 2 is a plan view showing the pixel structure according to a first embodiment of the present invention, and FIG. 3 is a sectional view showing the pixel structure according to the first embodiment of the present invention.

Referring to FIGS. 2 and 3, the pixel 15 includes the first to third sub-pixels 100 to 300 connected to the gate line 2, the first to third data lines 5 to 7, the first source voltage lines 9, and the second source voltage line 13. Although FIG. 2 does not show in detail that the first to third sub-pixels 100 to 300 are connected to the gate line 2, the first to third data lines 5 to 7, the first source voltage line 9, and the second source voltage line 13, the pixel 15 is not limited to the pixel structure of FIG. 2. In the following description, the elements and structure that have already been described with reference to FIG. 1 will be omitted in order to avoid redundancy.

The first sub-pixel 100 is formed in the first direction D1 longer than in the second direction D2, and includes the first thin film transistor circuit unit 31 and the first light emitting unit 41 (FIG. 3). FIG. 3 shows only one thin film transistor connected to the first light emitting unit 41 among thin film transistors of the first thin film transistor circuit unit 31 for the purpose of explanation.

The first thin film transistor circuit unit 31 includes a plurality of thin film transistors, and is electrically connected to the gate line 2 and the first data line 5. The first thin film transistor circuit unit 31 includes a first gate electrode 101 formed on a substrate 70 including a transparent insulating material, an insulating layer 111 formed on the first gate electrode 101, a first semiconductor layer 121 overlapped with the first gate electrode 101 on the insulating layer 111, a first source electrode 131 formed on both the first semiconductor layer 121 and the insulating layer 111, and a first drain electrode 133 facing the first source electrode 131. The first thin film transistor circuit unit 31 is insulated and protected from external shocks by a first protective layer 141. In this case, the first thin film transistor circuit unit 31 is not limited to a bottom gate structure, but may have a top gate structure.

The first light emitting unit 41 is electrically connected to the first thin film transistor circuit unit 31, and formed longer in the first direction D1 than in the second direction D2. The first light emitting unit 41 includes a first pixel electrode 171 formed on a second protective layer 161 and connected to the first drain electrode 133 through a first contact hole 165, a first organic light emitting layer 181 formed on the first pixel electrode 171, and a common electrode 500 formed on the first organic light emitting layer 181 to include a light reflecting material. The common electrode 500 may include aluminum (Al), silver (Ag), or the like in one example.

The first organic light emitting layer 181 is filled in a first opening pattern 410 of a pattern defining layer 400 formed on both the second protective layer 161 and the first pixel electrode 171. The first organic light emitting layer 181 includes an organic material generating green light to emit the green light to an exterior in one example.

The first pixel electrode 171 has a first width W1 in the second direction D2, and a first length L1 in the first direction D1. The length of the first pixel electrode 171 can adjust an aperture ratio of the first light emitting unit 41. For example, when the light from the first organic light emitting layer 181 passes through the first pixel electrode 171 to be discharged through a rear surface of the substrate 70, the aperture ratio of the first light emitting unit 41 can be improved as the length of the first pixel electrode 171 is increased. Although FIG. 2 does not show in detail that the first thin film transistor circuit unit 31 is connected to the first pixel electrode 171, the present invention is not limited thereto.

The second sub-pixel 200 is adjacent to the first sub-pixel 100, and extends longer in the first direction D1 than in the second direction D2. The second sub-pixel 200 includes the second thin film transistor circuit unit 33 and the second light emitting unit 43 (FIG. 3). FIG. 3 shows only one thin film transistor connected to the second light emitting unit 43 among thin film transistors of the second thin film transistor circuit unit 33 for the purpose of explanation.

The second thin film transistor circuit unit 33 includes a plurality of thin film transistors, and is electrically connected to the gate line 2 and the second data line 6. The second thin film transistor circuit unit 33 includes a second gate electrode 201, the insulating layer 111, a second semiconductor layer 221, a second source electrode 231, and a second drain electrode 233.

The second light emitting unit 43 is electrically connected to the second thin film transistor circuit unit 33, and extends longer in the first direction D1 than in the second direction D2. The second light emitting unit 43 includes the second pixel electrode 271 connected to the second drain electrode 233 through a second contact hole 265, a second organic light emitting layer 281 formed on the second pixel electrode 271, and the common electrode 500 formed on the second organic light emitting layer 281.

The second organic light emitting layer 281 is filled in a second opening pattern 420 of the pattern defining layer 400. In one example, the second organic light emitting layer 281 includes an organic material generating red light to emit the red light to an exterior. The second organic light emitting layer 281 may have the same area as that of the first organic light emitting layer 181. In other words, in the pattern defining layer 400, the second opening pattern 420 may have the same area as that of the first opening pattern 410.

The second pixel electrode 271 has the first width W1 in the second direction D2, and has a second length L2 in the first direction D1 longer than the first length L1. The second pixel electrode 271 having the second length L2 is wider than the first pixel electrode 171 having the first length L1. Although FIG. 2 does not show in detail that the second thin film transistor circuit unit 33 is connected to the second pixel electrode 271, the present invention is not limited thereto.

The third sub-pixel 300 is adjacent to the first sub-pixel 100, and extends in the first direction D1. The third sub-pixel 300 includes the third thin film transistor circuit unit 35 and the third light emitting unit 45 (FIG. 3). FIG. 3 shows only one thin film transistor connected to the third light emitting unit 45 among thin film transistors of the third thin film transistor circuit unit 35 for the purpose of explanation.

The third thin film transistor circuit unit 35 includes a plurality of thin film transistors, and is electrically connected to the gate line 2 and the third data line 7. The third thin film transistor circuit unit 35 includes a third gate electrode 301, the insulating layer 111, a third semiconductor layer 321, a third source electrode 331, and a third drain electrode 333.

The third light emitting unit 45 is electrically connected to the third thin film transistor circuit unit 35, and extends longer in the first direction D1 than in the second direction D2. The third light emitting unit 45 includes a third pixel electrode 371 connected to the third drain electrode 333 through a third contact hole 365, a third organic light emitting layer 381 formed on the third pixel electrode 371, and the common electrode 500 formed on the third organic light emitting layer 381.

The third organic light emitting layer 381 is filled in a third opening pattern 430 of the pattern defining layer 400. In one example, the third organic light emitting layer 381 includes an organic material generating blue light to emit the blue light to an exterior. The third organic light emitting layer 381 may have the same area as that of the second organic light emitting layer 281. In other words, in the pattern defining layer 400, the third opening pattern 430 may have the same area as that of the first and second opening patterns 410 and 420.

The third pixel electrode 371 has the first width W1 in the second direction D2, and has a third length L3 in the first direction D1 longer than the second length. The third pixel electrode 371 having the third length L3 is wider than the second pixel electrode 271 having the second length L2. Although FIG. 2 does not show in detail that the third thin film transistor circuit unit 35 is connected to the third pixel electrode 371, the present invention is not limited thereto.

The first, second, and third pixel electrodes 171, 271, and 371 have areas divided according to a predetermined ratio. For example, on the assumption that the total areas of the first, second, and third electrodes 171, 271, and 371 corresponds to 100%, the first electrode 171 occupies about 36% of the total area, the second pixel electrode 271 occupies about 23% of the total area, and the third pixel electrode 371 occupies about 41% of the total area.

The second source voltage line 13 is arranged corresponding to the first, second, and third pixel electrodes 171, 271, and 371. The second source voltage line 13 extends in the second direction D2 while crossing the first to third sub-pixels 100 to 300. The second source voltage line 13 has the second width W2 in the first direction D1 in the first sub-pixel 100. The second source voltage line 13 has the third width W3, which is narrower than the second width W2, in the first direction D1 in the second sub-pixel 200, and has a fourth width W4, which is narrower than the third width W3, in the first direction D1 in the third sub-pixel 300. The area of the second source voltage line 13, which has been reduced to the fourth width W4 due to the third pixel electrode 371, is enlarged toward the first and second pixel electrodes 171 and 271 by the second and third widths W2 and W3, so that the whole area of the second source voltage line 13 can be maintained. Accordingly, the increase of resistance caused by area reduction of the second source voltage line 13 can be overcome.

The first, second, and third sub-pixels 100, 200, and 300 include the first pixel electrode 171, the second pixel electrode 271, and the third pixel electrode 371, respectively, having the same width and different lengths. The first, second, and third sub-pixels 100, 200, and 300 include the first organic light emitting layer 181, the second organic light emitting layer 281, and the third organic light emitting layer 381 having the same area and generating green, red, and blue light, respectively, to express green, red, and blue colors, respectively.

The third sub-pixel 300 has a light emission area wider than those of the first and second sub-pixels 100 and 200, so that the third sub-pixel 300 can have a light emitting efficiency identical to those of the first and second sub-pixels 100 and 200. In addition, the first to third organic light emitting layers 181, 281, and 381 have the same area, so that the number of masks can be reduced in the manufacturing process.

Figure 4:
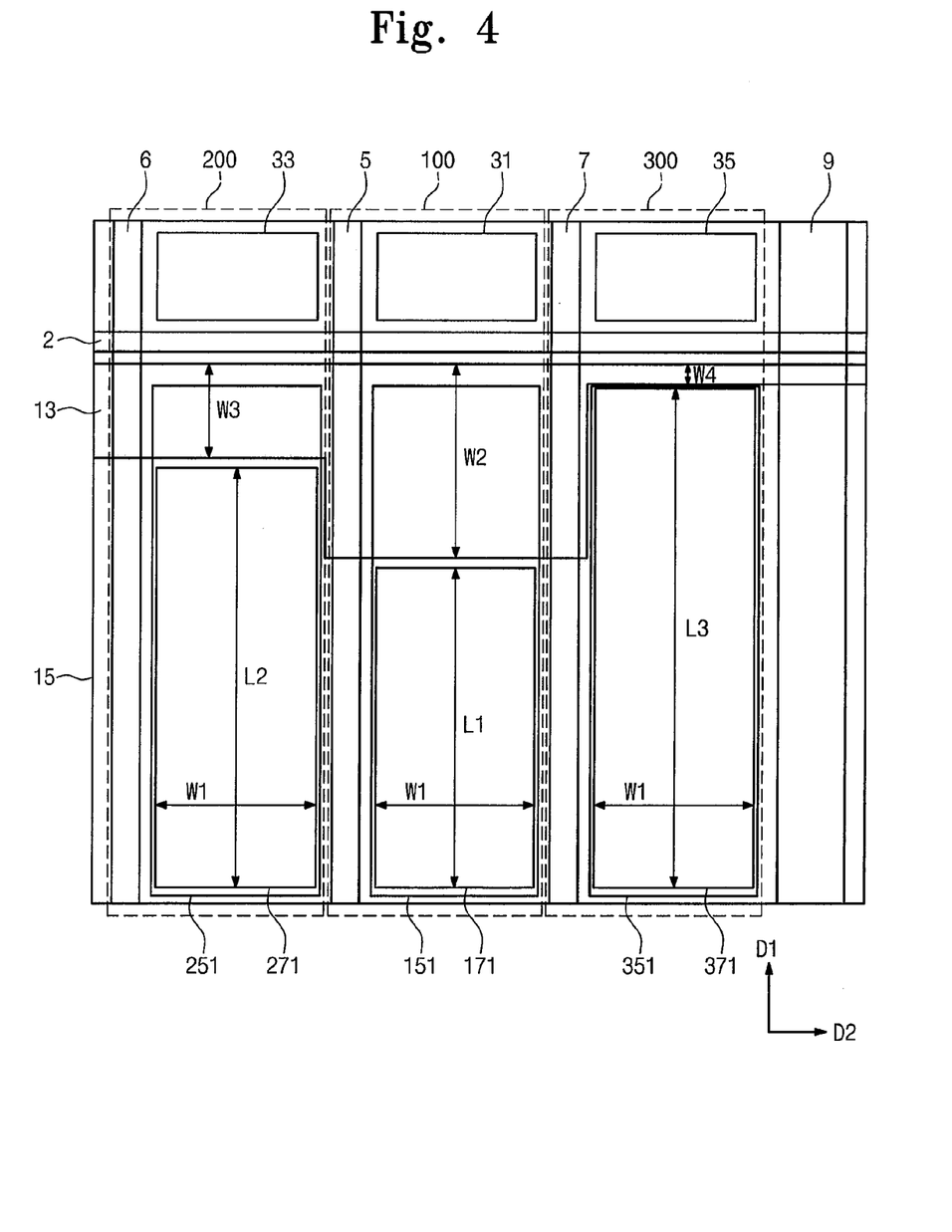
FIG. 4 is a plan view showing a pixel structure according to a second embodiment of the present invention.
Figure 5:
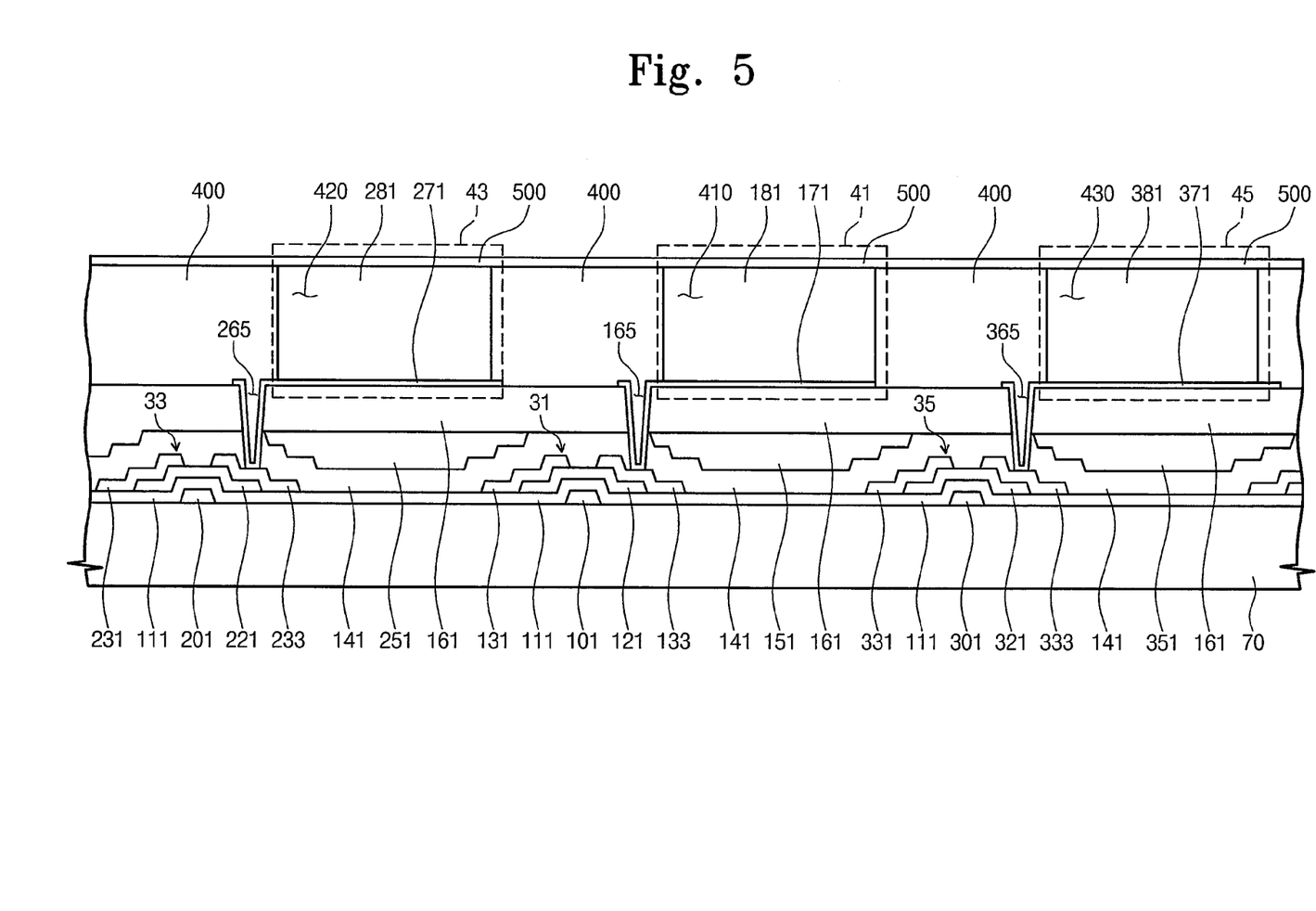
FIG. 5 is a sectional view showing the pixel structure according to the second embodiment of the present invention.

FIG. 4 is a plan view showing a pixel structure according to a second embodiment of the present invention, and FIG. 5 is a sectional view showing the pixel structure according to the second embodiment of the present invention. Hereinafter, details of the same portions as FIGS. 2 and 3 will be omitted in order to avoid redundancy.

Referring to FIGS. 4 and 5, the pixel 15 includes the gate line 2, the first to third data lines 5, 6, and 7, the first source voltage line 9, and the first, second, and third sub-pixels 100, 200, and 300 connected to the second source voltage line 13.

The first sub-pixel 100 includes the first thin film transistor circuit unit 31, the first light emitting unit 41 connected to the first thin film transistor circuit unit 31, and a first color filter layer 151 overlapped with the first light emitting unit 41.

The first light emitting unit 41 includes the first pixel electrode 171, the first organic light emitting layer 181, and the common electrode 500. The first pixel electrode 171 has the first width W1 in the second direction D2, and has the first length L1 in the first direction D1. The first organic light emitting layer 181 is filled in the first opening pattern 410 of the pattern defining layer 400. The first organic light emitting layer 181 includes an organic material generating white light to emit the white light to an exterior.

The first color filter layer 151 is provided below the first pixel electrode 171 while being overlapped with the first pixel electrode 171. In one example, the first color filter layer 151 is represented in a green color. For example, the first color filter layer 151 is wider than the first pixel electrode 171, and changes white light incident onto the first color filter layer 151 through the first pixel electrode 171 into green light.

The second sub-pixel 200 includes the second thin film transistor circuit unit 33, the second light emitting unit 43 connected to the second thin film transistor circuit unit 33, and a second color filter layer 251 overlapped with the second light emitting unit 43.

The second light emitting unit 43 includes the second pixel electrode 271, the second organic light emitting layer 281, and the common electrode 500. The second pixel electrode 271 has the first width W1 in the second direction D2 and the second length L2 in the first direction D1. The second organic light emitting layer 281 is filled in the second opening pattern 420 of the pattern defining layer 400, and includes an organic material generating white light to emit white light to an exterior. The second organic light emitting layer 281 has the same area as that of the first organic light emitting layer 181.

The second color filter layer 251 is provided below the second pixel electrode 271 while being overlapped with the second pixel electrode 271. The second color filter layer 251 is represented in a red color. The second color filter layer 251 has the same area as that of the first color filter layer 151, and changes white light incident onto the second color filter layer 251 while passing through the second pixel electrode 271 into red light.

The third sub-pixel 300 includes the third thin film transistor circuit unit 35, the third light emitting unit 45 connected to the third thin film transistor circuit unit 35, and a third color filter layer 351 overlapped with the third light emitting unit 45.

The third light emitting unit 45 includes the third pixel electrode 371, the third organic light emitting layer 381, and the common electrode 500. The third pixel electrode 371 has the first width W1 in the second direction D2 and the third length L3 in the first direction D1. The third organic light emitting layer 381 is filled in the third opening pattern 430 of the pattern defining layer 400, and includes an organic material generating white light to emit white light to an exterior. The third organic light emitting layer 381 has the same area as those of the first and second organic light emitting layers 181 and 381.

The third color filter layer 351 is provided below the third pixel electrode 371 while being overlapped with the third pixel electrode 371. The third color filter layer 351 is represented in a red color. The third color filter layer 351 has the same area as those of the first and second color filter layers 151 and 251, and changes white light incident onto the third color filter layer 351 while passing through the third pixel electrode 371 into blue light.

The first to third sub-pixels 100 to 300 include the first, second, and third pixel electrodes 171, 271, and 371 having the same width and different lengths. The first to third sub-pixels 100 to 300 include the first color filter layer 151, the second color filter layer 251, and the third color filter layer 351 having the same area and realized in green, red, and blue colors. Accordingly, the first to third sub-pixels 100 to 300 display green, red, and blue colors with different light emission areas, so that the first to third sub-pixels 100 to 300 can have substantially identical light emitting efficiency.

In addition, the first color filter layer 151, the second color filter layer 251, and the third color filter layer 351 have the same area, and the first organic light emitting layer 181, the second organic light emitting layer 281, and the third organic light emitting layer 381 have the same area, so that the number of masks can be reduced in the manufacturing process.

Hereinafter, a method of manufacturing the display panel according to one embodiment of the present invention will be described with reference to FIGS. 6 and 7.

Figure 6:
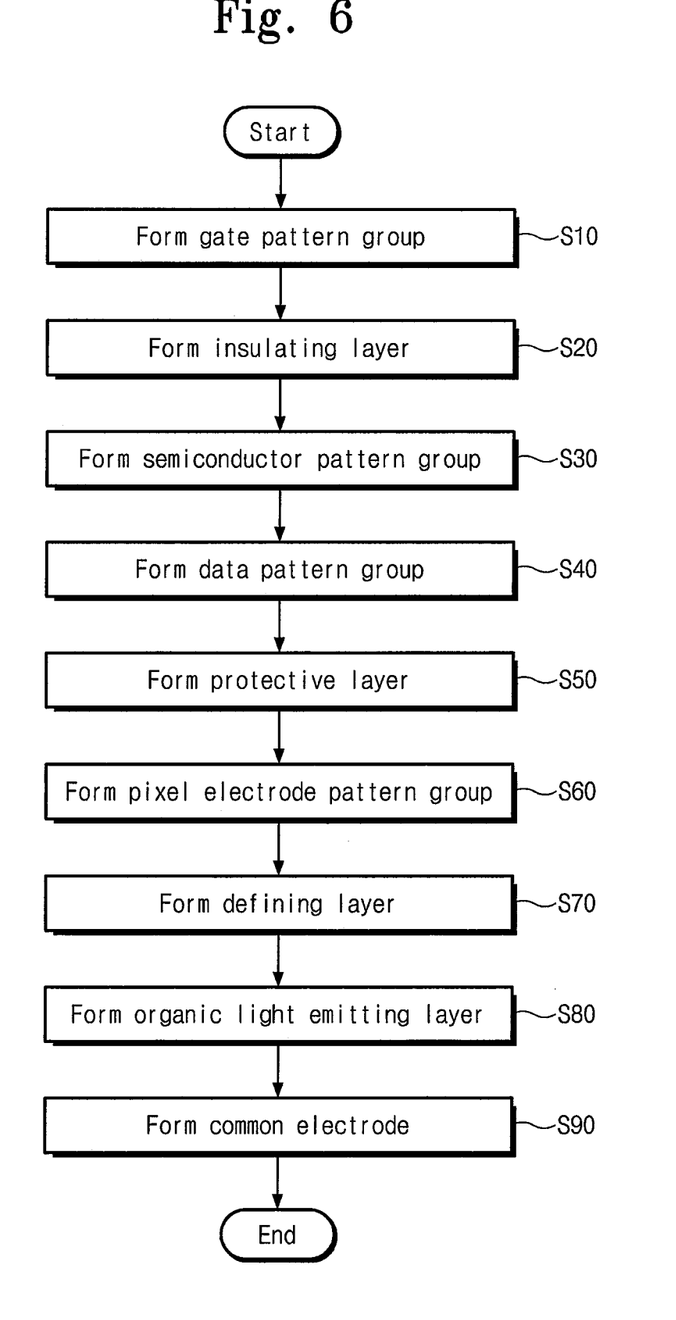
FIG. 6 is a flowchart showing a method of manufacturing a display panel according to an embodiment of the present invention.
Figure 7:
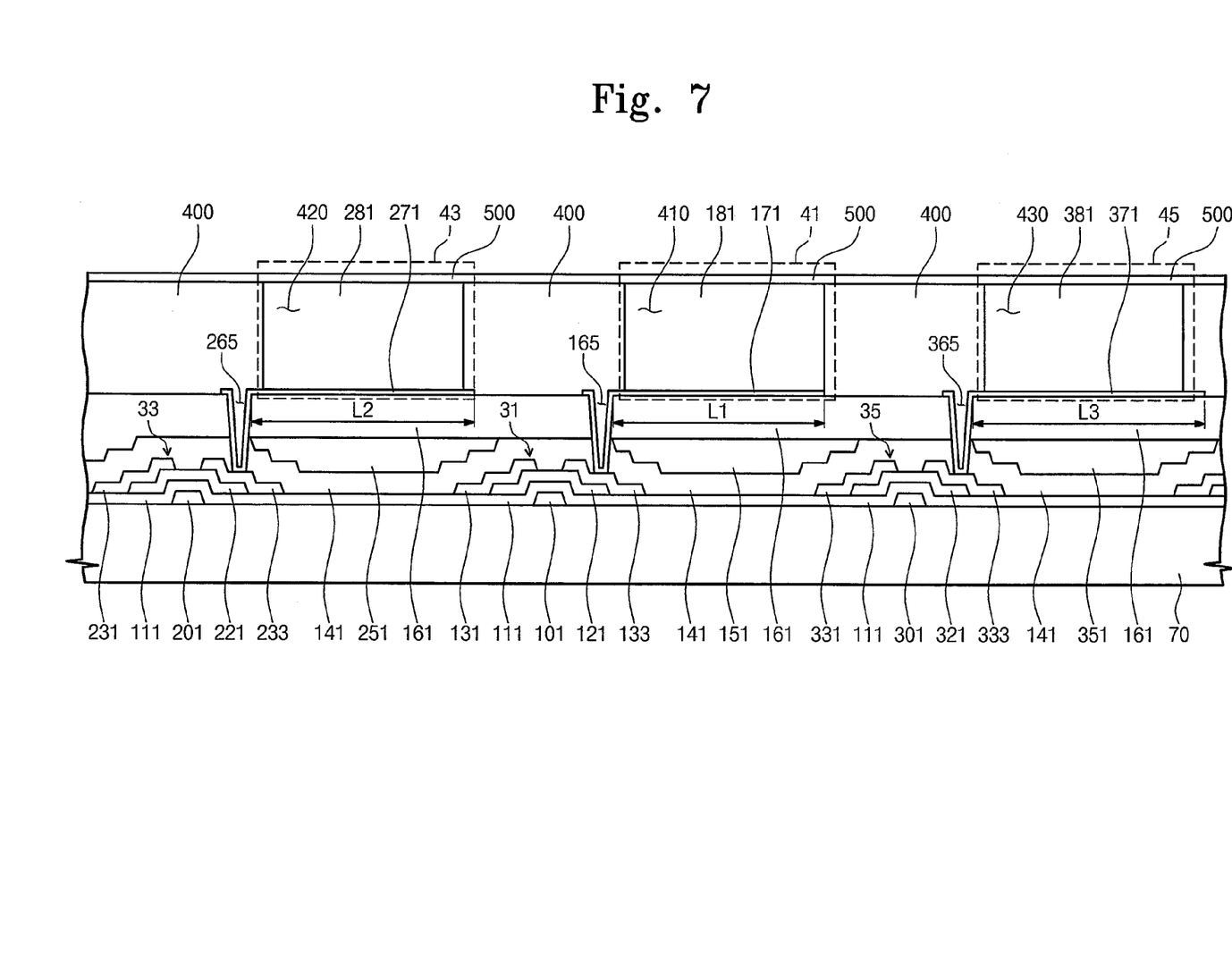
FIG. 7 is a sectional view showing the method of manufacturing the display panel of FIG. 6.

FIG. 6 is a flowchart showing the method of manufacturing the display panel according to an embodiment of the present invention, and FIG. 7 is a sectional view showing the method of manufacturing the display panel of FIG. 6.

Referring to FIGS. 6 and 7, a gate pattern group, including a gate line, the first gate electrode 101, the second gate electrode 201, and the third gate electrode 301, is formed on the substrate 70 including a transparent insulating material (S10). After depositing gate metal on the substrate 70 through sputtering in one example, the gate metal is patterned through a photolithography process. Accordingly, the gate line extending in one direction of the substrate 70, and the first, second, and third gate electrodes 101, 201, and 301 branching from the gate line are formed.

Then, the insulating layer 111 is formed on both the substrate 70 and the gate pattern group (S20). For example, after depositing silicon nitride (SiNx), silicon oxide (SiOX), or the like on both the substrate 70 and the gate pattern group through PECVD (Plasma Enhanced Chemical Vapor Deposition), the insulating layer 111 may be formed.

Subsequently, a semiconductor pattern group is formed on the insulating layer 111 (S30). After depositing a semiconductor material on the insulating layer 111, the semiconductor material is patterned, thereby forming the first semiconductor layer 121 overlapped with the first gate electrode 101, the second semiconductor layer 221 overlapped with the second gate electrode 201, and the third semiconductor layer 321 overlapped with the third gate electrode 301. The semiconductor material may include amorphous silicon and doped amorphous silicon. In addition, the first, second, and third semiconductor layers 121, 221, and 321 may include an active layer and an ohmic-contact layer.

Next, a data pattern group is formed on both the insulating layer 111 and the semiconductor pattern group (S40). In detail, after depositing data metal on both the insulating layer 111 and the semiconductor pattern group through sputtering. Thereafter, the data metal is patterned through a photolithography process, thereby forming the first source and drain electrodes 131 and 133 connected to the first semiconductor layer 121, the second source and drain electrodes 231 and 233 connected to the second semiconductor layer 221, and the third source and drain electrodes 331 and 333 connected to the third semiconductor layer 321.

Subsequently, after forming the first protective layer 141 on the insulating layer 111, the semiconductor pattern group, and the data pattern group, the second protective layer 161 is formed (S50). The first protective layer 141 is formed by depositing an inorganic material such as silicon nitride (SiNx), silicon oxide (SiOx), or the like. The second protective layer 161 having a flat surface is formed by depositing an organic material such as polyimide, polyamide, acryl, or benzocyclobutene (BCB). In addition, the first and second protective layers 141 and 161 are partially removed, thereby forming the first, second, and third contact holes 165, 265, and 365 exposing a portion of the first, second, and third drain electrodes 133, 233, and 333, respectively.

Thereafter, a pixel electrode pattern group is formed on the second protective layer 161 (S60). A transparent conductive material such as indium tin oxide (ITO) or indium zinc oxide (IZO) is deposited on the second protective layer 161. The transparent conductive material is patterned through a photolithography process, thereby forming the first, second, and third pixel electrodes 171, 271, and 371 connected to the first, second, and third drain electrodes 133, 233, and 333 through the first, second, and third contact holes 165, 265, and 365, respectively.

The first, second, and third pixel electrodes 171, 271, and 371 are patterned to have the same width and different lengths. The first pixel electrode 171 has the first length L1, the second pixel electrode 271 has the second length L2 longer than the first length L1, and the third pixel electrode 371 has the third length L3 longer than the second length L2.

Next, the pattern defining layer 400 is formed on the second protective layer 161 and the pixel electrode pattern group (S70). In detail, after depositing an organic material such that the second protective layer 161 and the pixel electrode pattern group are covered, the organic material is etched such that the first, second, and third pixel electrodes 171, 271, and 371 are exposed. The etching process is performed by using mask patterns having the same width. Accordingly, the organic material is etched, thereby forming the first, second, and third opening patterns 410, 420, and 430 having the same area.

Then, the first, second, and third organic light emitting layers 181, 281, and 381 are formed on the first, second, and third opening patterns 410, 420, and 430, respectively (S80). In detail, organic materials generating green, red, and blue light are filled in the first, second, and third opening patterns 410, 420, and 430, respectively, thereby forming the first, second, and third organic light emitting layers 181, 281, and 381. The first, second, and third organic light emitting layers 181, 281, and 381 emitting green, red, and blue light are filled in the first, second, and third opening patterns 410, 420, and 430 having the same area, so that the first, second, and third organic light emitting layers 181, 281, and 381 have the same area. Accordingly, when forming the first, second, and third organic light emitting layers 181, 281, and 381 emitting green, red, and blue light, the number of masks can be reduced.

In addition, an organic material generating white light may be filled in the first, second, and third opening patterns 410, 420, and 430, thereby forming the first, second, and third organic light emitting layers 181, 281, and 381. The first, second, and third organic light emitting layers 181, 281, and 381 emitting white light have the same area.

Subsequently, the common electrode 500 is formed on the pattern defining layer 400 and the first, second, and third organic light emitting layers 181, 281, and 381 (S90). For example, a material (e.g., aluminum (Al), silver (Ag), or the like) that reflects light is deposited on the pattern defining layer 400 and the first, second, and third organic light emitting layers 181, 281, and 381. Accordingly, the first light emitting unit 41 includes the first pixel electrode 171, the first organic light emitting layer 181, and the common electrode 500, the second light emitting unit 43 includes the second pixel electrode 271, the second organic light emitting layer 281, and the common electrode 500, and the third light emitting unit 45 includes the third pixel electrode 371, the third organic light emitting layer 381, and the common electrode 500.

Meanwhile, if the first, second, and third organic light emitting layers 181, 281, and 381 generate white light, a color filter pattern group may be further formed between the first and second protective layers 141 and 161 when the first and second protective layers 141 and 161 are formed. For example, after the first protective layer 141 is formed on the insulating layer 111, the semiconductor pattern group, the data pattern group, and the first, second, and third color filter layers 151, 251, and 351 are formed in regions in which the first protective layer 141 is overlapped with the first, second, and third pixel electrodes 171, 271, and 371. After depositing a material representing a green color on the first protective layer 141, the material is patterned, thereby forming the first color filter layer 151 such that the first color filter layer 151 overlaps the first color filter electrode 171. After depositing a material representing a red color on the first protective layer 141, the material is patterned, thereby forming the second color filter layer 251 such that the second color filter layer 251 overlaps the second color filter electrode 271. After depositing a material representing a blue color on the first protective layer 141, the material is patterned, thereby forming the third color filter layer 351 such that the third color filter layer 351 overlaps the third color filter electrode 371. At this time, the first, second, and third color filter layers 151, 251, and 351 are formed by using masks having the same pattern area. Accordingly, the number of masks used to form the first, second, and third color filter layers 151, 251, and 351 can be reduced.

Although embodiments of the present invention have been described, it is understood that the present invention should not be limited to these embodiments but various changes and modifications can be made by one ordinary skilled in the art within the spirit and scope of the present invention as hereinafter claimed.

What is claimed is:
1. A display panel, comprising:
a power line supplying a power; and
a plurality of rectangular pixel areas, each of which includes a portion of the power line and a plurality of sub-pixel regions, and receives the power to display an image;
wherein each of the pixel areas comprises:

a plurality of driving thin film transistors to receive the power such that driving signals are output, each of the driving thin film transistors positioned in a respective sub-pixel region; and a plurality of pixel electrodes, each pixel electrode connected to a respective driving thin film transistor, having a relatively longer length in a first direction, and having a same width in a second direction substantially perpendicular to the first direction, wherein at least one of the plurality of pixel electrodes is longer than the remaining pixel electrodes in the first direction, each pixel electrode including a first side along the second direction that is aligned with a first side of the pixel area and a second side opposite the first side, and wherein the portion of the power line is interposed between the driving thin film transistors and the pixel electrodes in the sub-pixel regions, and wherein a first side of the portion of the power line is adjacent to the driving thin film transistors and is parallel with a second side of the pixel area that is opposite the first side of the pixel area, and a width of the portion of the power line in the first direction between the first side of the portion of the power line and an opposite side of the portion of the power line that is adjacent and parallel to the second side of the pixel electrodes varies depending on the length of the pixel electrodes.

2. The display panel of claim 1, further comprising three color filter layers positioned below the plurality of pixel electrodes and having a same area.

3. The display panel of claim 2, wherein the three color filter layers have red, green, and blue colors, respectively.

4. The display panel of claim 3, wherein the color filter layer having the blue color is provided below one pixel electrode, which has a longest length in the first direction, among the plurality of pixel electrodes.

5. The display panel of claim 3, further comprising three organic light emitting layers with each positioned on a respective pixel electrode to generate white light.

6. The display panel of claim 1, wherein the power line supplies a voltage having a ground level to the driving thin film transistors.

7. The display panel of claim 1, further comprising three organic light emitting layers with each provided on a respective pixel electrode and having a same area.

8. The display panel of claim 7, wherein the three organic light emitting layers generate red, green, and blue light, respectively.

9. The display panel of claim 8, wherein the organic light emitting layer generating the blue light is provided below one pixel electrode, which has a longest length in the first direction, among the plurality of pixel electrodes.

10. The display panel of claim 9, wherein the power line supplies a voltage having a ground voltage level to the driving thin film transistors.

* * * * *